United States Patent
Kinoshita et al.

(10) Patent No.: US 8,950,061 B2
(45) Date of Patent: Feb. 10, 2015

(54) ELECTRONIC COMPONENT MOUNTING DEVICE

(75) Inventors: Yutaka Kinoshita, Yamanashi (JP); Nobuhiro Nakai, Yamanashi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 97 days.

(21) Appl. No.: 13/578,091

(22) PCT Filed: Mar. 2, 2012

(86) PCT No.: PCT/JP2012/001463
§ 371 (c)(1),
(2), (4) Date: Aug. 9, 2012

(87) PCT Pub. No.: WO2012/147259
PCT Pub. Date: Nov. 1, 2012

(65) Prior Publication Data
US 2013/0118006 A1    May 16, 2013

(30) Foreign Application Priority Data
Apr. 28, 2011  (JP) .................................. 2011-101089

(51) Int. Cl.
*H05K 13/04* (2006.01)
*H05K 13/00* (2006.01)

(52) U.S. Cl.
CPC .......... *H05K 13/046* (2013.01); *H05K 13/0061* (2013.01)
USPC ........................................................ 29/739

(58) Field of Classification Search
CPC ........................ H05K 13/0061; H05K 13/046
USPC ............................................ 29/739–741, 743
See application file for complete search history.

(56) References Cited

FOREIGN PATENT DOCUMENTS

| JP | 2001-274600 A | 10/2001 |
|----|---------------|---------|
| JP | 2002-173949 A | 6/2002 |
| JP | 3671681 B2 | 4/2005 |
| JP | 2010-263069 A | 11/2010 |
| JP | 2010263069 A * | 11/2010 |

OTHER PUBLICATIONS

International Search Report for PCT/JP2012/001463 dated Mar. 2, 2012.

* cited by examiner

*Primary Examiner* — Livius R Cazan
(74) *Attorney, Agent, or Firm* — Pearne & Gordon LLP (57) ABSTRACT

In the substrate-bottom receiving mechanism 20 of the lane A transporting conveyor 2A and lane B transporting conveyor 2B of the electronic component mounting device, on the rectangular-plate-shaped bottom receiving plate 23 that holds the bottom receiving pins 25 such that the bottom receiving position can be adjusted there is a rotating holding part 32 that rotates around pivotal shaft 31; the holding parts 30, which normally do not protrude over the upper surface and which protrude over the upper surface to be grasped only in the fetching operation by the operator, are arranged on the end surfaces on the upstream side and downstream side with respect to the substrate transporting direction of the bottom receiving plate 23, respectively; and the operator can hold the rotating holding part 32 to remove the bottom receiving plate 23.

2 Claims, 5 Drawing Sheets

(a) CROSS-SECTIONAL VIEW TAKEN ACROSS D-D (b) CROSS-SECTIONAL VIEW TAKEN ACROSS E-E

ELECTRONIC COMPONENT MOUNTING DEVICE

TECHNICAL FIELD

The present invention relates to an electronic component mounting device for mounting electronic components on substrates.

BACKGROUND ART

An electronic component mounting device for manufacturing an mounted substrate with electronic components mounted on the substrate has a substrate transporting mechanism for transporting substrates from the upstream side to the downstream side. For the substrates as the operation subjects in the electronic component mounting devices, in addition to the single-side mounted substrate with components mounted only on one side, there is also the so-called double-side mounted substrate having electronic components mounted on both sides. In the mounting step of operation of the double-side mounted substrate, first of all, mounting is carried out for the first surface, then the substrate is inverted and mounting is carried out on the second surface. When mounting is carried out on the second surface, the first surface where the electronic components have been mounted faces downward, so that the electronic components become obstacles to the operation for positioning and holding the substrate at the mounting position, and the mounted surface cannot be directly supported for the surface.

In consideration of the problem, researchers have proposed a substrate-bottom receiving mechanism, a system in which the portions for supporting the bottom outside the mounted portions of electronic components on the mounted surface are appropriately selected, and these portions are supported by bottom receiving pins (for example, see Patent Reference 1). For the substrate-bottom receiving mechanism as an example of the prior art described in the patent reference, there is a guide for sliding and pulling the bottom receiving plate that holds the bottom receiving pins to the outer side of the transporting conveyor. In the stage exchange operation that is executed each time the type of the substrate as the subject is changed, the bottom receiving plate should be pulled to the outer side of the transporting conveyor, then the configuration of the bottom receiving pins is adjusted corresponding to the new substrate type.

REFERENCES OF PRIOR ART

Patent References

Patent Reference 1: Japanese Patent No. 3671681

ABSTRACT OF THE INVENTION

Problems that the Invention is to Solve

In recent years, as the substrate transporting mechanism, the mechanism having transporting conveyors arranged as two rows has been adopted. With this constitution, it is possible to realize a variety of substrate transporting forms with two substrates as the subjects, so that the electronic component mounting device has high flexibility and excellent operation efficiency. However, for the electronic component mounting device with a constitution having two rows of transporting conveyors, there is the problem of poor operability when the substrate-bottom receiving mechanism with the constitution is adopted. That is, for the constitution having two rows of transporting conveyors, it is necessary to pull the bottom receiving plates from the respective transporting conveyors to the two sides of the substrate transporting mechanism. Consequently, the operator has to carry out the operation to move the bottom receiving plates to the two sides of the substrate transporting mechanism, respectively. This leads to a decrease in the operation efficiency in the manufacturing process wherein the stage exchange operation is often carried out together with switching of the product type.

The purpose of the present invention is to provide an electronic component mounting device that has a constitution with a substrate transporting mechanism having two rows of transporting conveyors, and that can execute the stage exchange operation along with switching of the substrate type with a high operability and high efficiency.

Means for Solving the Problem

The electronic component mounting device of the present invention is an electronic component mounting device that uses a substrate transporting mechanism to transport the electronic components fetched from the component supplying part by an mounting head to position them at the component mounting position, and to mount the electronic components on the substrate; the electronic component mounting device has the following parts: a head moving mechanism that moves the mounting head between the component supplying part and the component mounting position, two rows of transporting conveyors that transport the substrates in the substrate transporting direction and that set them at the component mounting positions, a substrate-bottom receiving mechanism, which receives from the lower surface side of the positioned substrate set at the component mounting position by multiple bottom receiving pins, and a bottom receiving plate in a rectangular plate shape, which holds the bottom receiving pins in the substrate-bottom receiving mechanism such that the bottom receiving position can be adjusted. The bottom receiving plate has holding parts for fetching on the two side end surfaces on the upstream side and downstream side, respectively; the holding parts usually do not protrude from the upper surface, and when the operator carries out the fetching operation, the holding parts protrude from the upper surface.

Effects of the Invention

According to the present invention, the rectangular-plate-shaped bottom receiving plate that holds the bottom receiving pins in the substrate-bottom receiving mechanism such that the bottom receiving position can be adjusted has holding parts for fetching on the two side end surfaces on the upstream side and downstream side, respectively; the holding parts usually do not protrude from the upper surface and when the operator carries out the fetching operation, the holding parts protrude from the upper surface. As a result, with the constitution having a substrate transporting mechanism having two rows of transporting conveyors, it is possible to execute the stage exchange operation along with switching of the substrate type at a high operability and high efficiency.

BRIEF DESCRIPTION OF THE DRAWINGS

FIGS. 2(a), (b) are diagrams illustrating the constitution of the substrate transporting mechanism and the substrate-bottom receiving mechanism of the electronic component mounting device in an embodiment of the present invention.

FIGS. 3(a), (b) are diagrams illustrating the structure of the holding part for fetching that is equipped in the substrate-bottom receiving mechanism of the electronic component mounting device in an embodiment of the present invention.

FIGS. 4(a), (b), (c) are diagrams illustrating the fetching operation of the bottom receiving plate in the substrate-bottom receiving mechanism of the electronic component mounting device in an embodiment of the present invention.

FIGS. 5(a), (b) are diagrams illustrating the structure and function of the holding part for fetching that is equipped in the substrate-bottom receiving mechanism of the electronic component mounting device in an embodiment of the present invention.

BEST MODE FOR CARRYING OUT THE INVENTION

In the following, the embodiment of the present invention will be explained with reference to figures. First of all, the overall constitution of the electronic component mounting device 1 will be explained with reference to FIG. 1. Here, the electronic component mounting device 1 has the function whereby the electronic components fetched by the mounting head from the component supplying part are transported by the substrate transporting mechanism and are mounted on the substrate positioned at the component mounting position.

Figure 1:
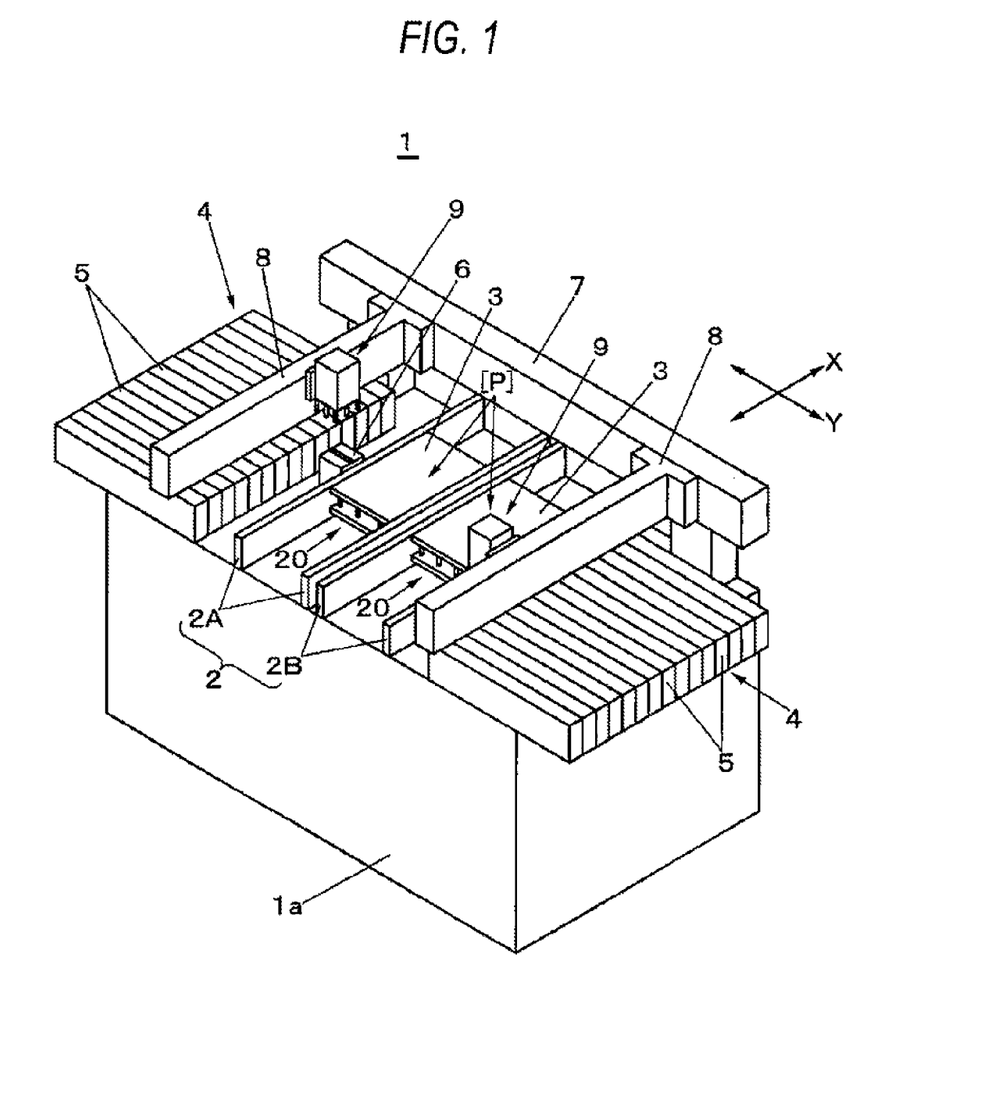
FIG. 1 is an oblique view illustrating the electronic component mounting device in an embodiment of the present invention.

As shown in FIG. 1, a substrate transporting mechanism 2 is arranged in the X-direction (substrate transporting mechanism) on the base 1a. In the substrate transporting mechanism 2, two transporting lanes A, B that can transport substrates independently are arranged. Two rows of lane A transporting conveyor 2A and lane B transporting conveyor 2B form the substrate transporting mechanism 2. The lane A transporting conveyor 2A and lane B transporting conveyor 2B transport the substrates 3 fetched from the upstream-side preceding-step device from the upstream side to the downstream side along the substrate transporting direction; the substrates 3 are then positioned at the component mounting positions [P] set on the lane A transporting conveyor 2A and lane B transporting conveyor 2B, respectively. The substrates 3 at the component mounting positions [P] have the electronic components mounted on them; they are then sent to the downstream-side succeeding-step device.

Figure 2:
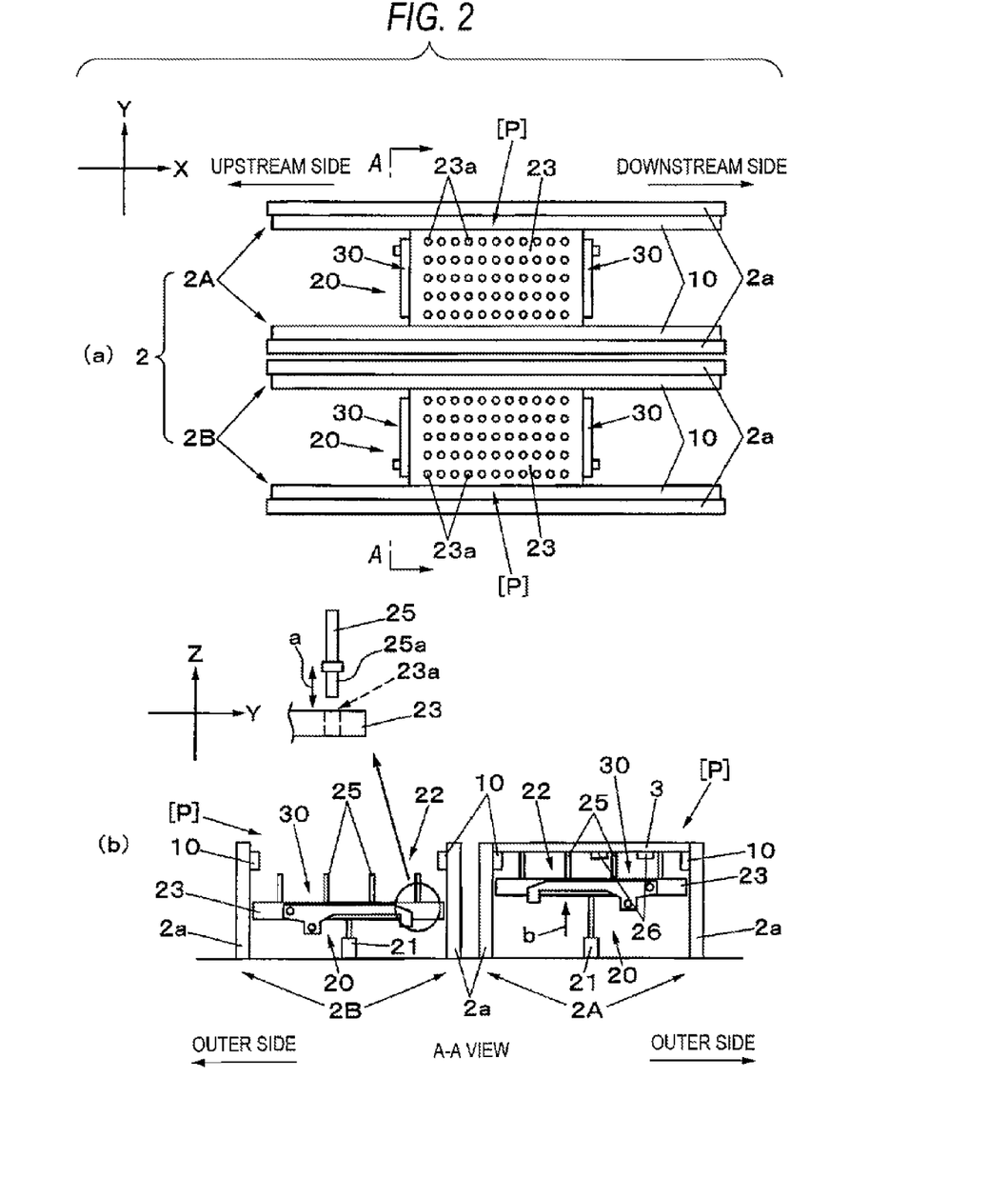

At each of the component mounting positions [P], a substrate-bottom receiving mechanism 20 having a function to bottom-receive from the lower surface side of the positioned substrate 3 is arranged by means of multiple bottom receiving pins 25 (see FIG. 2(b)). Here, the substrate-bottom receiving mechanism 20 is arranged so that the configuration of the bottom receiving pins 25 can be adjusted corresponding to the substrate 3 as the subject, so that the substrate 3 of the double-side mounting type with electronic components mounted on one surface in the preceding step of the operation can be handled as the subject of the operation. That is, on the lower surface side of the substrate 3, the regions that are free of mounted components 26 (see FIG. 2(b)) and that allow support are pre-selected; the configuration of the bottom receiving pins 25 is adjusted correspondingly, so that it is possible to bottom-receive the double-side mounting substrates of different types.

On each side of the substrate transporting mechanism 2, a component supplying part 4 is arranged. Here, in each component supplying part 4, multiple tape feeders 5 are installed. As the tape feeders 5 conduct pitch feeding of the carrier tapes holding the electronic components, the electronic components are fed to the component fetching positions by the component mounting mechanism to be explained later.

On one end portion in the X-direction of the base 1a, a Y-axis moving table 7 equipped with a linear driving mechanism is arranged horizontally in the Y-direction. On the Y-axis moving table 7, two X-axis moving tables 8 also having a linear driving mechanism are coupled with each other in a freely sliding way in the Y-direction. On each of the X-axis moving tables 8, an mounting head 9 having multiple sucking nozzles (not shown in the figure) on the lower end portion is installed in a freely sliding way in the X-direction.

The X-axis moving tables 8 are arranged corresponding to the component supplying parts 4 arranged on the two sides of the substrate transporting mechanism, respectively. As the Y-axis moving table 7 and X-axis moving table 8 are driven, the mounting head 9 is driven to move in the horizontal direction, so that the electronic components are fetched from tape feeders 5 of the component supplying parts 4, respectively, and they are transferred and carried on the substrate 3 positioned at the mounting operation position of the substrate transporting mechanism 2. In the constitution, the Y-axis moving table 7 and the X-axis moving table 8 form the head moving mechanism for moving the mounting head 9 between the component supplying parts 4 and the component mounting positions [P].

The component recognition device 6 is arranged between the component supplying parts 4 and the substrate transporting mechanism 2. When the mounting head 9 that has fetched the electronic components from the component supplying parts 4 moves above the component recognition device 6, the component recognition device 6 takes a picture of the electronic components held on the mounting head 9 and recognizes them. In the component mounting operation by the mounting head 9, on the basis of the result of recognition of components by component recognition device 6, correction of the position is carried out as the mounting head 9 is positioned with respect to substrate 3.

In the following, with reference to FIGS. 2(a), (b), the constitution of the substrate transporting mechanism 2 will be explained in detail. Here, FIG. 2(b) is a cross-sectional view taken across A-A of FIG. 2(a). As shown in FIG. 2(a), the substrate transporting mechanism 2 comprises two rows of lane A transporting conveyor 2A and lane B transporting conveyor 2B. Here, each of the lane A transporting conveyor 2A and lane B transporting conveyor 2B has a pair of guide rails 2a mounted in the belt conveyor mechanism 10. The substrates 3 carried on the belt conveyor mechanism 10 are transported along the guide rails 2a.

The central portion of each of the lane A transporting conveyor 2A and lane B transporting conveyor 2B becomes the component mounting position [P] with respect to substrate 3. The substrate 3 carried to the component mounting position [P] is pin-supported by multiple bottom receiving pins 25 for the supportable regions on the lower surface side by the substrate-bottom receiving mechanism 20 while the substrate is positioned by the substrate stop unit (not shown in the figure) at the prescribed reference position.

The substrate-bottom receiving mechanism 20 shown in FIG. 2(b) has a bottom receiving unit 22 that can be lifted freely by a lift driving part 21. The bottom receiving unit 22 has a rectangular-plate-shaped bottom receiving plate 23 that is coupled in a quick connected/disconnected way with the lift driving part 21, and, on the bottom receiving plate 23, multiple pin supporting holes 23a are formed in a lattice configuration. The bottom receiving pins 25 are arranged so that the lower inserting portions 25a of the bottom receiving pins 25 are inserted through (in the direction indicated by arrow a) the pin supporting holes 23a at the positions corresponding to the supportable regions free of the mounted components 26 on the lower surface of the substrate 3. That is, the bottom receiving plate 23 has the function of holding the [substrate] while the bottom receiving positions of the bottom receiving pins 25 in the substrate-bottom receiving mechanism 20 can be adjusted.

As can be seen from the substrate-bottom receiving mechanism 20 at the lane A transporting conveyor 2A, as the lift driving part 21 is driven, the bottom receiving unit 22 rises together with the bottom receiving pins 25 (in the direction indicated by arrow b), so that the bottom receiving pins 25 come in contact with the supportable regions free of the mounted components 26 on the lower surface side of the substrate 3, and support it from below. When the type of substrate 3 as the subject of the bottom receiving is changed, the configuration of the bottom receiving pins 25 in the bottom receiving unit 22 is changed corresponding to the new substrate type, as the stage exchange operation is carried out. In this case, in order to carry out the stage exchange operation at a high efficiency, it is preferred that the bottom receiving plate 23 be removed from the substrate-bottom receiving mechanism 20 with an excellent operability in the operation performed. For this purpose, according to the electronic component mounting device of this embodiment, in order to facilitate removal of the bottom receiving plate 23, which forms the substrate-bottom receiving mechanism 20, from the device, the bottom receiving plate 23 already has the holding parts 30 for the operator to fetch the bottom receiving plate 23 on the two side end surfaces on the upstream side and the downstream side, respectively.

Figure 3:
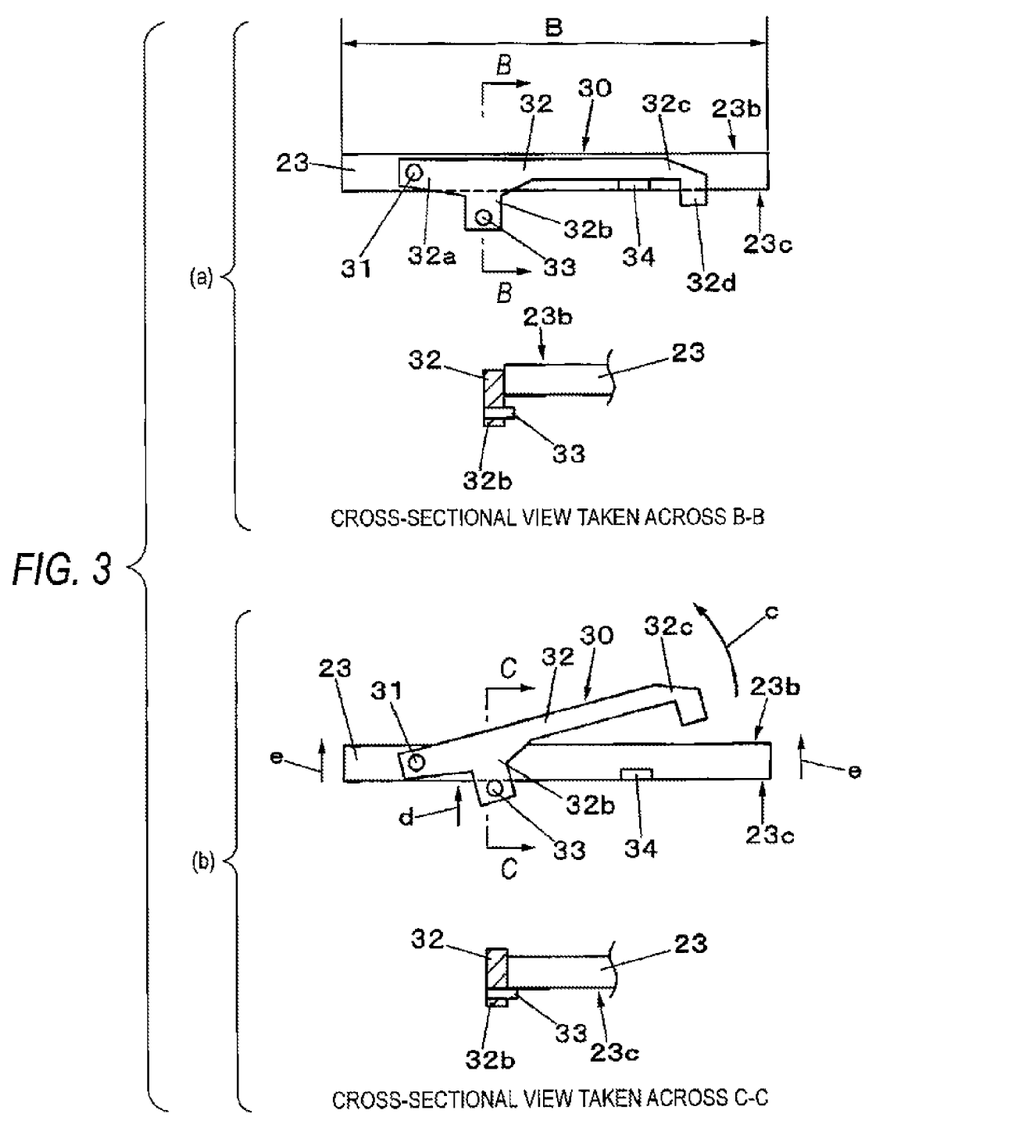

In the following, with reference to FIGS. 3(a), (b), the constitution of holding parts 30 will be explained. FIGS. 3(a), (b) show the two side end surfaces on the upstream side and downstream side of the bottom receiving plate 23, respectively. As shown in FIG. 3(a), on the side end surface of the bottom receiving plate 23, a horizontal pivotal shaft 31 is planted. In addition, a rotating holding part 32 that rotates in the vertical plane with respect to the horizontal pivotal shaft 31 as the pivot is arranged. The pivotal end portion 32a on one side of the rotating holding part 32 is a rod shaped part pivoted by the pivotal shaft 31. It is preferred that this rod shaped part have a length dimension half or more the width dimension B of the bottom receiving plate 23. The other end side of the pivotal end portion 32a in the rotating holding part 32 becomes the holding part 32c for the operator to hold. At the tip of the holding part 32c, a bending tip portion 32d for securing holding is arranged, bent downward. In addition, in the middle position between the pivotal end portion 32a and the center, a locking part 32b for locking the bottom receiving plate 23 is arranged extending downward and, at the locking part 32b, a locking part 33 is anchored so that it extends to the lower surface side of the bottom receiving plate 23.

FIG. 3(a) shows the normal state when the holding parts 30 for fetching do not work. In this state, the rotating holding part 32 is kept at the position where it contacts from above the stopper 34 anchored on the bottom receiving plate 23 under its own weight; it does not protrude above the upper surface 23b of the bottom receiving plate 23, so that it does not hamper the function of the bottom receiving plate 23. In this state, the locking part 33 is at a position separated from the lower surface 23c of the bottom receiving plate 23.

FIG. 3(b) shows the state in which the holding parts 30 are adopted to work. Here, as the holding part 32c is pulled up (in the direction indicated by arrow c), the rotating holding part 32 is rotated around the pivotal shaft 31, so that the space for the operator to grasp the holding part is guaranteed under the holding part 32c. That is, when the operation carries out the fetching operation, the rotating holding part 32 of the holding parts 30 for fetching can be held as it protrudes from the upper surface 23b of the bottom receiving plate 23. Next, as it is rotated to above the holding part 32c, the locking part 32b is displaced upward (indicated by the arrow d) and, as the locking part 33 contacts the lower surface 23c, rotation of the rotating holding part 32 is stopped. As the rotating holding part 32 is further pulled up, the bottom receiving plate 23 is held and raised up together with the rotating holding part 32 (indicated by the arrow e).

FIGS. 3(a), (b) show the holding parts 30 adopted in the substrate-bottom receiving mechanism 20 in the lane B transporting conveyor 2B. Here, when the bottom receiving plate 23 is installed in the substrate-bottom receiving mechanism 20, the pivotal shaft 31 with the constitution is located on the outer side in the width direction of the lane B transporting conveyor 2B. Similarly, for the holding parts 30 adopted in the substrate-bottom receiving mechanism 20 in the lane A transporting conveyor 2A, when the bottom receiving plate 23 is installed in the substrate-bottom receiving mechanism 20, the pivotal shaft 31 is located on the outer side in the width direction of the lane A transporting conveyor 2A.

As the position of the pivotal shaft 31 is located on the outer side in the width direction of the conveyor as explained above, the holding part 32c held by the operator is always located on the inner side of the substrate transporting mechanism 2. Consequently, for the operator on any side of the substrate transporting mechanism 2, the holding part 32c of the holding parts 30 for fetching of the lane A transporting conveyor 2A and lane B transporting conveyor 2B is always located within the operation-reachable range for the operator, that is, at a position that can be easily reached as the operator stretches his/her arm. As a result, the operability is improved.

Figure 4:
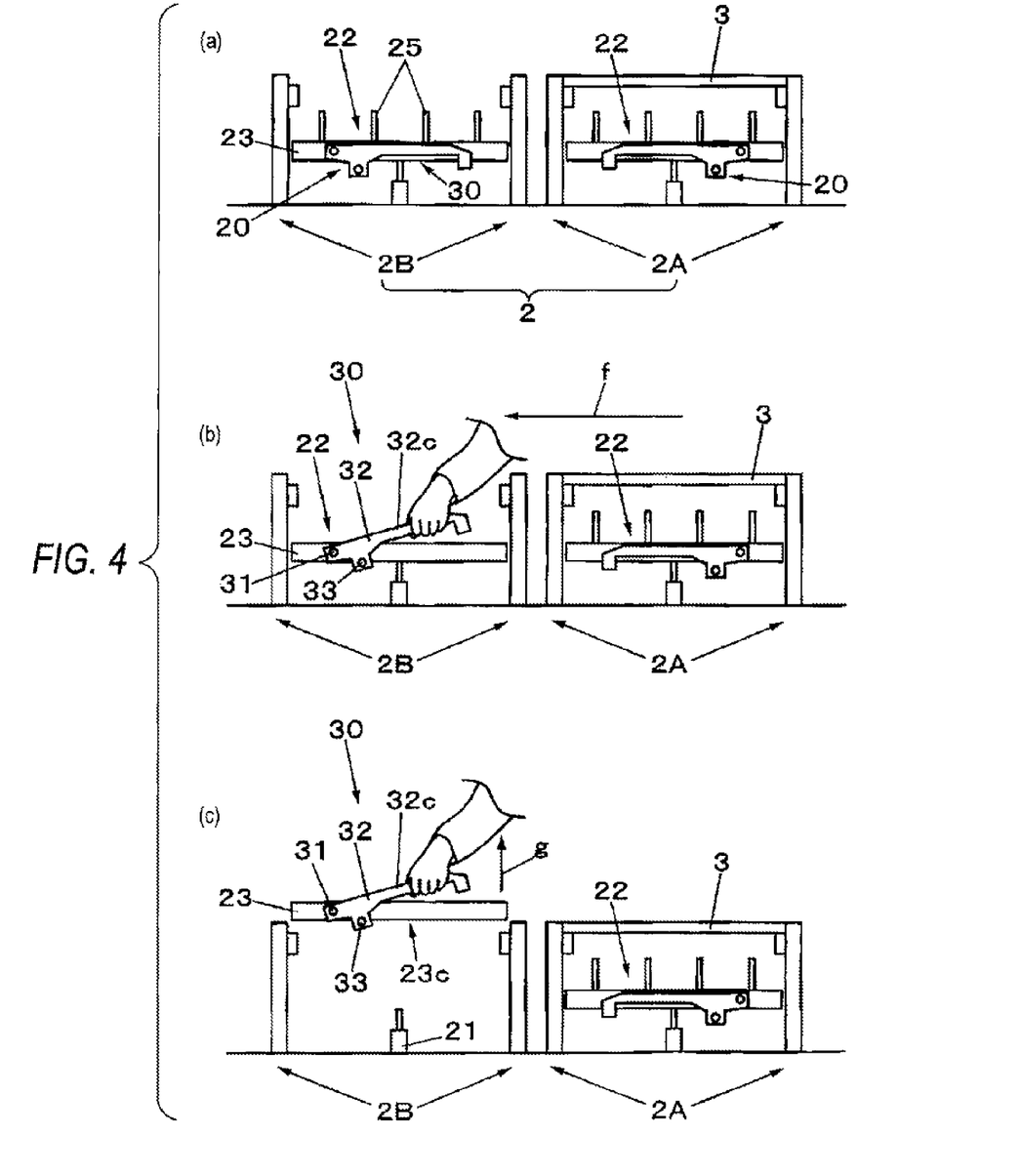

FIGS. 4(a)-(c) illustrate the main points of the operation carried out in the lane substrate transporting mechanism 2 comprising A transporting conveyor 2A and lane B transporting conveyor 2B equipped with the substrate-bottom receiving mechanism 20 with the constitution when the stage exchange operation is executed along with a change of the substrate type for one of the transporting conveyors (lane B transporting conveyor 2B in this example). As shown in FIG. 4(a), the lane A transporting conveyor 2A continues the component mounting operation with substrates 3 as the subject and, for the lane B transporting conveyor 2B, after the end of the prescribed manufacturing lot, the configuration of the bottom receiving pins 25 is changed corresponding to the new substrate type as the stage exchange operation starts. Here, the operator for executing the operation is located on the outer side of the lane A transporting conveyor 2A, and the operator strides over the lane A transporting conveyor 2A to carry out the operation with the lane B transporting conveyor 28 as the subject.

First of all, the bottom receiving pins 25 arranged on the bottom receiving unit 22 of the lane B transporting conveyor 2B are pulled out and removed from the pin supporting holes 23a of the bottom receiving plate 23 (see FIG. 2(a)). Next, as shown in FIG. 4(b), the operator located on the outer side of the lane A transporting conveyor 2A stretches his/her arm via above the lane A transporting conveyor 2A (in the direction indicated by arrow f) to hold the holding part 32c, then rotates the rotating holding part 32 around the pivotal shaft 31. Due to this rotation, the locking part 33 contacts the lower surface 23c of the bottom receiving plate 23. In this state, the holding part 32c is further raised (indicated by the arrow g). As a result, as shown in FIG. 4(c), the bottom receiving plate 23 is raised together with the rotating holding part 32, and it is separated from the lift driving part 21 and is removed from the lane B transporting conveyor 2B.

In this case, as the pivotal shaft 31 is located on the outer side in the width direction of the lane B transporting conveyor 2B, and the holding part 32c is located on the inner side of the lane B transporting conveyor 2B, the holding part 32c of the holding subject is located closer to the operator. Consequently, although there are two rows of transporting conveyors in the substrate transporting mechanism, the stage exchange operation along with exchange of the substrate type still can be executed with excellent operability and at a high efficiency.

Figure 5:
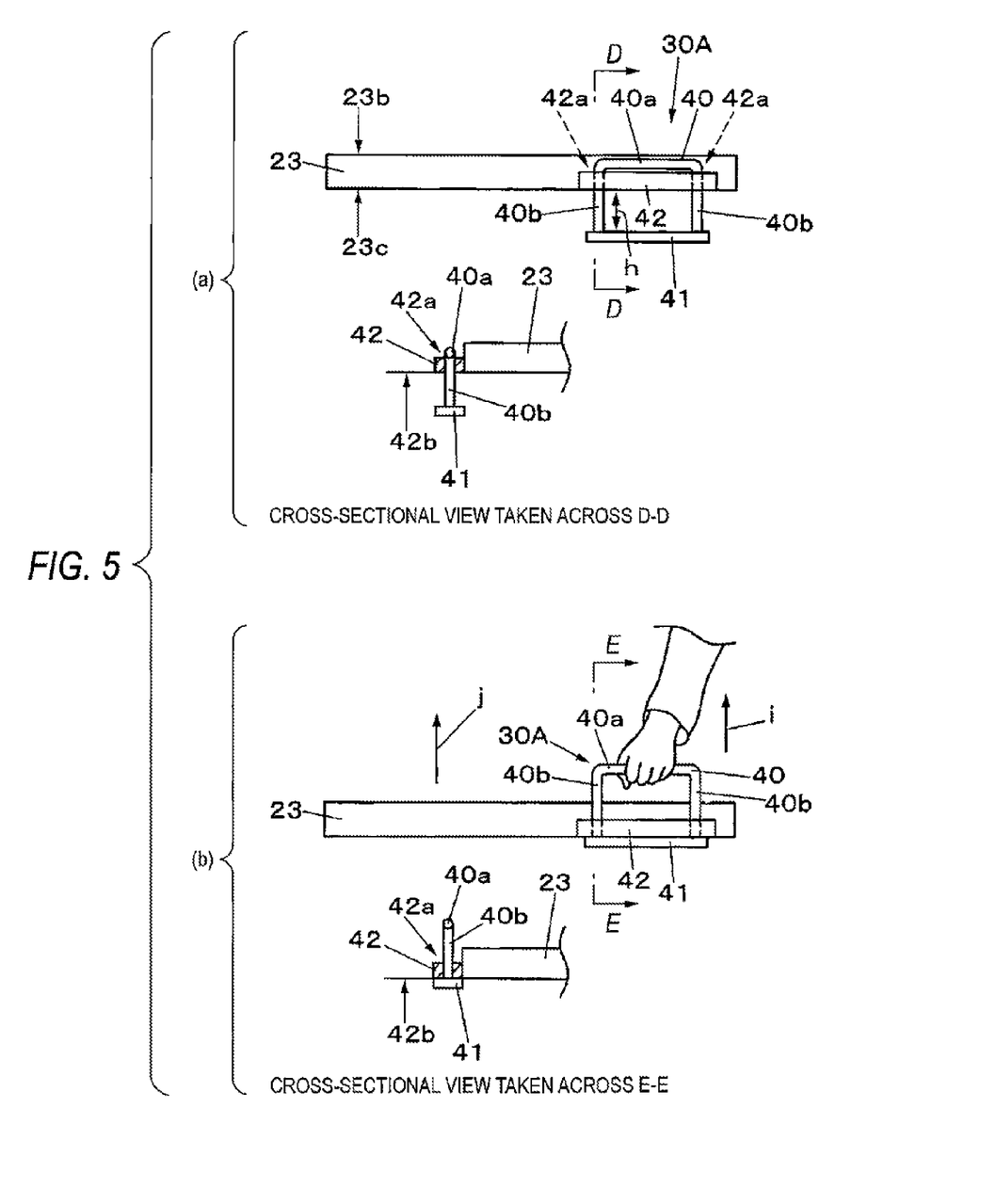

In the following, an example in which a holding part for fetching 30A with a different constitution is used instead of the holding part 30 for fetching with a constitution having a rod shaped rotating holding part 32 rotating around the horizontal pivotal shaft 31 will be explained with reference to FIGS. 5(a), (b). FIGS. 5(a), (b) show the two side end surfaces on the upstream side and downstream side, respectively, on the bottom receiving plate 23 just as that shown in FIGS. 3(a), (b). As shown in FIG. 5(a), on the side end surface of the bottom receiving plate 23, a holder 42 located on the inner side in the width direction of the transporting conveyor and extending in the horizontal direction is arranged; an inverted U-shaped slide holding part 40 is installed in a freely sliding way on the holder 42. That is, the slide holding part 40 has a shaft part formed in an inverted U-shape, that is, a shape that has vertical portions 40b extending downward from the two ends of the horizontal portion 40a located on the upper side. The lower ends of the two vertical portions 40b can be connected with each other by a slender horizontal locking plate 41. As the slide holding part 40 is installed on the holder 42, the vertical portions 40b are inserted through the slide holes 42a formed through in the vertical direction near the two ends of the holder 42, and the lower end portions of the two vertical portions 40b are connected by the locking plate 41.

As the vertical portions 40b slide in the slide holes 42a, the slide holding part 40 slide up/down with respect to the holder 42 (in the direction indicated by arrow h). Due to this sliding movement, the slide holding part 40 usually does not protrude above the upper surface 23b of the bottom receiving plate 23; it only protrudes from the upper surface 23b so that the operator can hold it when the operator carries out the fetching operation. As it makes a sliding movement, the locking plate 41 contacts the lower surface 42b of the holder 42, so that the upward related movement of the slide holding part 40 with respect to the holder 42 is restricted, and the bottom receiving plate 23 is locked by the slide holding part 40.

In the state shown in FIG. 5(b), which shows the state when the holding part for fetching 30A is adopted for working, the operator pulls up the horizontal portion 40a, so that the horizontal portion 40a can be held. As the slide holding part 40 is further pulled up (in the direction indicated by arrow i), at the time that the locking plate 41 contacts the lower surface 42b of the holder 42, the bottom receiving plate 23 is also raised together with the slide holding part 40 (in the direction indicated by arrow j). In this case, because the slide holding part 40 is located on the inner side in the width direction of the transporting conveyor on the bottom receiving plate 23, just as in the example shown in FIGS. 4(a)-(c), the operator can execute the operation for fetching the bottom receiving plate 23 with excellent operability.

As explained above, in the electronic component mounting device 1 of this embodiment, on the rectangular plate shaped bottom receiving plate 23 that holds the bottom receiving pins 25 such that the bottom receiving position can be adjusted in the substrate-bottom receiving mechanism 20, the holding parts 30 and 30A, which are for fetching and which normally do not protrude over the upper surface 23b but protrude over the upper surface 23b to be grasped only in the fetching operation by the operator, are arranged on the end surfaces on the upstream side and downstream side with respect to the substrate transporting direction, respectively. Consequently, with this constitution having a substrate transporting mechanism equipped with two rows of transporting conveyors, it is possible to execute the stage exchange operation along with a change of the substrate type with excellent operability and at a high efficiency.

According to the present invention, as long as the gist and range of the present invention are observed, the specialists can make various modifications and applications on the basis of the description of the specification as well as the prior art. This is also included in the range for which patent protection is desired. As long as the gist of the present invention is observed, the various composing requirements in the embodiment can be combined at will.

The present patent application is based on the Japanese Patent Application No. (Japanese Patent Application No. 2011-101089) filed on Apr. 28, 2011. The contents of the Japanese patent application are included here as a reference. The present patent application is a national stage entry of PCT/JP12/01463, filed on Mar. 2, 2012.

INDUSTRIAL APPLICABILITY

The electronic component mounting device of the present invention has a constitution with a substrate transporting mechanism having two rows of transporting conveyors. It has the effect of improving the operability and efficiency of the stage exchange operation along with a change in the substrate type, and it can be adopted in the field of mounting of electronic components on substrates to manufacture mounted substrates.

DESCRIPTION OF REFERENCE NUMERALS AND SIGNS 1 electronic component mounting device
2 substrate transporting mechanism
2A lane A transporting conveyor
2B lane B transporting conveyor
3 substrate
4 component supplying part
7 Y-axis moving table
8 X-axis moving table
9 mounting head
20 substrate-bottom receiving mechanism
22 bottom receiving unit
23 bottom receiving plate
25 bottom receiving pin
30, 30A holding part for fetching
31 pivotal shaft
32 rotating holding part
40 slide holding part

The invention claimed is:
1. An electronic component mounting device that mounts an electronic component fetched from a component supplying part by a mounting head on a substrate transported by a substrate transporting mechanism and positioned at a component mounting position, the electronic component mounting device comprising:

a head moving mechanism that moves the mounting head between the component supplying part and the component mounting position, two rows of transporting conveyors that constitute the substrate transporting mechanism, and that transport the substrate in a substrate transporting direction, the component mounting position set at each of the transporting conveyors;

a substrate-bottom receiving mechanism which is set at the component mounting position, and which receives the positioned substrate from a lower surface side of the substrate by multiple bottom receiving pins; and a bottom receiving plate in a rectangular plate shape, which holds the bottom receiving pins in the substrate-bottom receiving mechanism such that the bottom receiving position can be adjusted;

wherein the bottom receiving plate has holding parts for fetching on two side end surfaces on an upstream side and a downstream side in the substrate transporting direction, respectively, and a pivotal shaft having a longitudinal axis parallel to the substrate transporting direction and provided on each of the two side end surfaces, wherein each of the holding parts rotates around the its respective pivotal shaft;

the holding parts do not protrude from an upper surface of the bottom receiving plate when the holding parts are not used;

when an operator carries out the fetching operation, the holding parts protrude from the upper surface, wherein the holding parts for fetching have rod-shaped holding parts arranged on the two side end surfaces, respectively, and rotating around a horizontal pivot, wherein the two rows of transporting conveyors include a first transporting conveyor and a second transporting conveyor, and in the first transporting conveyor, the pivot is located on one end side of one of the rod-shaped holding parts, the one end side distant from the second transporting conveyor while the bottom receiving plate is installed in the substrate-bottom receiving mechanism.

2. The electronic component mounting device according to claim 1, wherein each of the holding parts comprises a locking part for locking the bottom receiving plate, and the locking part is arranged downward from each of the holding parts and anchored to extend to a lower surface side of the bottom receiving plate.

\* \* \* \* \*